(12) United States Patent
Witcraft

(10) Patent No.: US 7,037,604 B2
(45) Date of Patent: May 2, 2006

(54) MAGNETIC SENSING DEVICE

(75) Inventor: William F. Witcraft, Minneapolis, MN (US)

(73) Assignee: Honeywell International, Inc., Morristown, NJ (US)

( * ) Notice: Subject to any disclaimer, the term of this patent is extended or adjusted under 35 U.S.C. 154(b) by 226 days.

(21) Appl. No.: 10/201,381

(22) Filed: Jul. 23, 2002

(65) Prior Publication Data

US 2004/0019272 A1 Jan. 29, 2004

(51) Int. Cl.
*G11B 5/127* (2006.01)
*H01L 29/76* (2006.01)

(52) U.S. Cl. .................................. 428/816; 257/295
(58) Field of Classification Search ............. 428/336, 428/692; 360/110, 324, 327
See application file for complete search history.

(56) References Cited

U.S. PATENT DOCUMENTS

| | | | |
|---|---|---|---|
| 5,041,780 A | | 8/1991 | Rippel ................... 324/117 H |
| 5,247,278 A | * | 9/1993 | Pant et al. ................ 338/32 R |
| 5,570,015 A | | 10/1996 | Takaishi et al. ......... 324/207.21 |
| 5,898,548 A | * | 4/1999 | Dill et al. ................ 360/324.2 |
| 5,902,690 A | * | 5/1999 | Tracy et al. ................ 428/693 |
| 6,048,739 A | * | 4/2000 | Hurst et al. ..................... 438/3 |
| 6,072,382 A | * | 6/2000 | Daughton et al. ........ 338/32 R |
| 6,120,920 A | * | 9/2000 | Takada et al. ............... 428/693 |
| 6,404,191 B1 | * | 6/2002 | Daughton et al. ........... 324/252 |
| 6,731,474 B1 | * | 5/2004 | Terunuma et al. .......... 360/319 |
| 6,924,168 B1 | * | 8/2005 | Tuttle ............................. 438/64 |
| 2002/0024116 A1 | * | 2/2002 | Tuttle .......................... 257/630 |
| 2002/0048824 A1 | * | 4/2002 | Carr et al. ....................... 438/3 |
| 2003/0197211 A1 | * | 10/2003 | Bhattacharyya et al. .... 257/295 |
| 2004/0000415 A1 | * | 1/2004 | Rizzo et al. .............. 174/35 R |
| 2005/0130327 A1 | * | 6/2005 | Spielberger et al. ........... 438/3 |

FOREIGN PATENT DOCUMENTS

| | | |
|---|---|---|
| EP | 0 390 582 | 10/1990 |
| JP | 2002184945 | * 6/2002 |
| WO | WO 01/25807 | 4/2001 |
| WO | WO 01/35112 | 5/2001 |

OTHER PUBLICATIONS

"NMR Magnetic Shielding" (avaliable at http://www.acorn-nmr.com/appnotes/shielding.htm) Jan. 23, 2003.*
"MRI Shielded Rooms" (available at http://www.rfi-ind.com.au/download/MRI%20Brochure.pdf), date not available.*
Web document titled "Surface Mount Technology", copyright 2000 (http://www.internationalsensor.com/SMT_HTML/SMT_PAGE.htm).*
Derwent Abstract Translation of JP 2002-184945 A (Derwent Acc No. 2002-647880).*
International Search Report.

* cited by examiner

*Primary Examiner*—Kevin M. Bernatz
(74) *Attorney, Agent, or Firm*—McDonnell Boehnen; Hulbert & Berghoff LLP

(57) ABSTRACT

A magnetic sensing device is disclosed. The magnetic sensing device may have an integrated circuit and a magnetic sensor. A magnetic buffer layer of material may be deposited between the integrated circuit and the magnetic sensor to shield the magnetic sensor from stray electromagnetic fields generated by the integrated circuit. The magnetic buffer layer may also absorb electromagnetic fields generated by other internal sources of the magnetic sensing device.

14 Claims, 3 Drawing Sheets

MAGNETIC SENSING DEVICE

BACKGROUND

A. Field of Invention

The present invention relates to magnetic sensors, and more particularly, to shielding a magnetic sensing device from electromagnetic signals generated from within.

B. Description of Related Art

Magnetic sensors are typically used for direction finding or other means of navigation. The technology for sensing magnetic fields has evolved due to the need for improved sensitivity, smaller size, and compatibility with electronic systems.

Most navigation systems today use some type of magnetic compass to determine a heading direction. Using the Earth's magnetic field, electronic compasses based on magnetoresistive (MR) sensors can electrically resolve better than a 0.1 degree rotation of direction. An MR sensor measures the change in electrical resistance due to an external electrical or magnetic field. For example, the Earth's magnetic fields can cause a change in the resistance of an MR sensor, from which compass headings can be determined.

MR sensors provide a solid-state solution for building compass navigation systems. Their high sensitivity and effective repeatability, along with small size, results in a high accuracy magnetic sensor. However, integrating an MR sensor with electronic circuitry may not result in accurate magnetic measurements. Electromagnetic signals, such as current signals, within the electronic circuitry may interfere with signals from the Earth's magnetic field, and therefore, an accurate measurement of the Earth's magnetic field may not be obtained. An electric current always produces a magnetic field, which will interfere with a measurement of a low intensity magnetic field.

Existing MR sensor systems lack an ability to eliminate or reduce the magnetic field effects generated by electronics within the system, and so it is desirable to provide a device that eliminates stray electromagnetic signals in order to accurately measure a magnetic field.

SUMMARY

In an exemplary embodiment, a magnetic sensing device is provided which has an integrated circuit with a mating surface. The magnetic sensing device also has a magnetic shielding layer deposited onto the mating surface. The magnetic shielding layer absorbs electromagnetic signals generated by the integrated circuit. The magnetic sensing device also has a magnetic sensing layer deposited onto the magnetic shielding layer such that the magnetic sensing layer is substantially aligned with the integrated circuit.

In another embodiment, a magnetic sensing device is provided which has an integrated circuit that has a mating surface, a magnetic sensor coupled to the integrated circuit, and a magnetic buffer layer deposited between the integrated circuit and the magnetic sensor. The magnetic buffer layer comprises a magnetic shielding material that has a thickness of approximately 100–500 angstroms.

In still another embodiment, a method of internally shielding a magnetic sensing device is included. The method may comprise providing a magnetic shielding layer between a magnetic sensor and an integrated circuit. The magnetic shielding layer may absorb electromagnetic signals generated by the integrated circuit.

These as well as other features and advantages will become apparent to those of ordinary skill in the art by reading the following detailed description, with appropriate reference to the accompanying drawings.

BRIEF DESCRIPTION OF FIGURES

Reference is made to the attached drawings, wherein elements that have the same reference numeral designations represent like elements throughout and wherein.

DETAILED DESCRIPTION OF EXEMPLARY EMBODIMENTS

In an exemplary embodiment, a magnetic sensing device is presented that may accurately measure magnetic fields while in close proximity to an integrated circuit. The magnetic sensing device may have a magnetic sensor mounted over an integrated circuit to produce a system-on-a-chip. A magnetic shielding layer and/or magnetic absorption layer may be deposited between the magnetic sensor and the integrated circuit to provide a buffer layer that reduces and/or eliminates stray electromagnetic signals generated by the integrated circuit. In this manner, the magnetic sensor may accurately measure a magnetic field external to the device, which is independent of a magnetic field generated by electrical currents within the integrated circuit.

Figure 1:
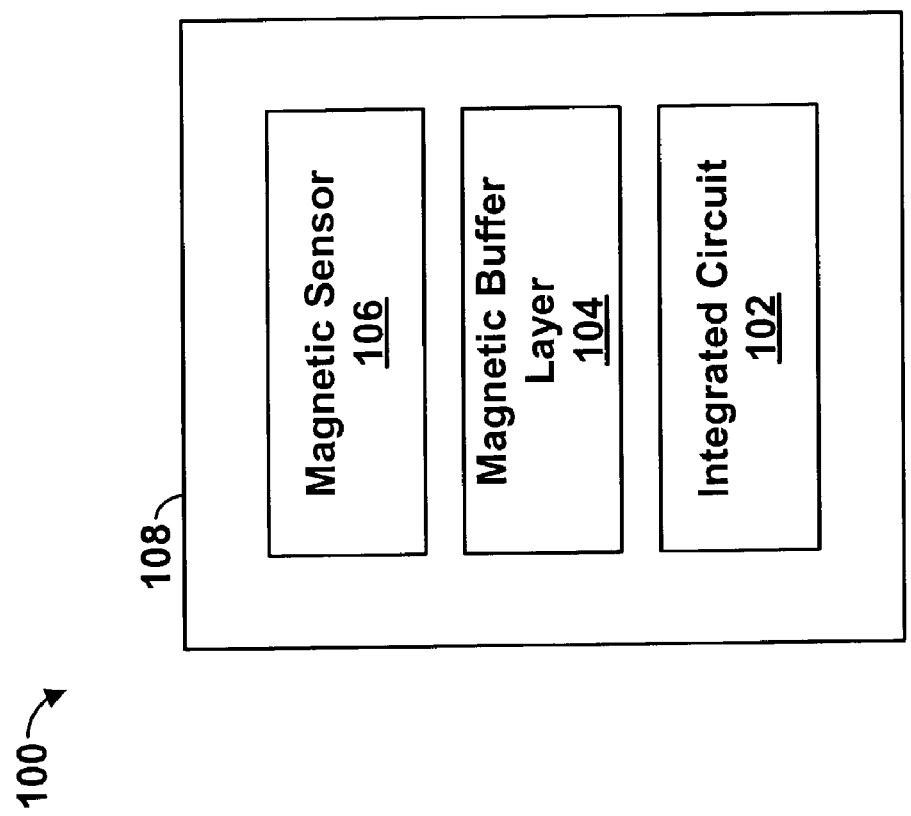
FIG. 1 is a block diagram illustrating one embodiment of a conceptual magnetic sensing system.

Referring to FIG. 1, an exemplary embodiment of a magnetic sensing system 100 is illustrated. While FIG. 1 illustrates the magnetic sensing system 100, other packages and/or a combination of sensors may be used as well. In addition, it should be understood that the magnetic sensing system 100 illustrated in FIG. 1 and other arrangements described herein are set forth for purposes of example only, and other arrangements and elements can be used instead and some elements may be omitted altogether, depending on manufacturing and/or consumer preferences.

By way of example, the magnetic sensing system 100 has an integrated circuit 102, a magnetic buffer layer 104, and a magnetic sensor 106. The integrated circuit 102, the magnetic buffer layer 104, and the magnetic sensor 106 may all be enclosed within a package 108, such as a plastic package, an electronic integrated circuit package that has multiple pin-outs, or a non-magnetic molded package. The package may also be a small outline integrated circuit (SOIC) package that has a copper lead frame. The magnetic sensing system 100 may also contain other sensing and/or electronic elements.

As illustrated in FIG. 1, the magnetic buffer layer 104 is positioned over the integrated circuit 102 and the magnetic sensor 106 is positioned over the magnetic buffer layer 104.

The magnetic sensor 106 may be positioned to be substantially aligned with the integrated circuit 102, or the magnetic sensor 106 may be positioned to be directly over the integrated circuit 102. Alternatively, the magnetic sensor 106, magnetic buffer layer 104, and the integrated circuit 102 may be positioned in entirely different arrangements as well. However, in the exemplary embodiment, it may be necessary to at least position the magnetic buffer layer 104 between the magnetic sensor 106 and the integrated circuit 102.

The integrated circuit 102 of the magnetic sensing system 100 may be a printed circuit board (PCB), an electronics board, an integrated circuit chip, or any integrated circuit operable to process electrical signals. The integrated circuit 102 may be a piece of silicon material or a complementary metal-oxide semiconductor (CMOS) bipolar material. The integrated circuit 102 may have both analog and digital outputs and may include components such as op-amps, amplifiers, or other signal-conditioning electronics. The integrated circuit 102 may also be other types of circuitry as well.

A magnetic field is generated by the integrated circuit 102 when electric charge carriers, i.e. electrons, move through electrical conductors (e.g., traces) of the integrated circuit 102. For example, an electric current can produce a magnetic field. A pulsating direct current, or an alternating current, characteristically produces an electromagnetic field. When charge carriers are accelerated (as opposed to moving at a constant velocity), a fluctuating magnetic field may be produced. This generates a fluctuating electric field, which in turn produces another varying magnetic field. This results in a growing electromagnetic field which may continue to grow without bound as the charge carriers continue to accelerate.

The magnetic buffer layer 104 may either shield the magnetic sensor 106 from electromagnetic fields generated by current flow within the integrated circuit 102, and/or the magnetic buffer layer 104 may absorb the electromagnetic fields generated by the integrated circuit 102. The magnetic buffer layer 104 may also shield and/or absorb electromagnetic fields generated by other internal sources of the magnetic sensing system 100. For absorption of electromagnetic fields, the magnetic buffer layer 104 may comprise a permalloy material. Alternatively, for shielding the electromagnetic fields, the magnetic buffer layer 104 may comprise a Mu-metal material. However, the magnetic buffer layer 104 may comprise any material with a high magnetic permeability (i.e., a high ratio of the magnetic flux density to the magnetic field strength) and/or any magnetic resistant material.

A permalloy material is typically comprised of nickel and iron. In one embodiment, the magnetic buffer layer 104 is comprised of a permalloy material composition that has about 60–80% nickel (Ni), 10–20% iron (Fe), 5–10% copper (Cu), and 5–10% cobalt (Co) (wt. %). The permalloy material composition may also be between 50–80% nickel and the balance iron.

A Mu-metal is a soft ferromagnetic material. As an example, the magnetic buffer layer 104 may be a Mu-metal material with approximately 77% Ni, 16% Fe, 5% Cu, and 2% chromium (Cr). Other Mu-metals may be used as well, such as Ni—Fe based metals with amounts of silicon (Si) and/or other similar elements added. Other elements may also be used.

The magnetic buffer layer 104 may be any ferromagnetic material that has a high magnetic permeability such as, for example, on the order of $10^4$ H/m (Henries per meter). Other examples are possible as well.

The magnetic buffer layer 104 may be approximately a few hundred angstroms in thickness, although the thickness may be more or less than a few hundred angstroms. For example, for a magnetic sensing system designed to measure the Earth's magnetic field, the magnetic buffer layer 104 may be approximately 100–500 angstroms.

The magnetic buffer layer 104 may be deposited onto a mating surface of the integrated circuit 102 by an electrodeposition process such as pressure vapor deposition (PVD) or ion-beam deposition. Alternatively, the magnetic buffer layer 104 may be deposited onto the integrated circuit 102 by a chemical vapor deposition (CVD), an atmospheric pressure chemical vapor deposition (APCVD), a low-pressure chemical vapor deposition (LPCVD), a plasma enhanced chemical vapor deposition (PECVD), or other deposition techniques. The magnetic buffer layer 104 may be deposited only in an area between the integrated circuit 102 and the magnetic sensor 106 or possibly onto a greater area of the integrated circuit 102 to reduce and/or eliminate stray or leakage current and/or magnetic fields. For example, the magnetic buffer layer 104 may be deposited over the entire mating surface of the integrated circuit 102, as defined by the area between the integrated circuit 102 and the magnetic sensor 106 or as defined by the entire surface area of the integrated circuit 102.

The magnetic buffer layer 104 may enable the magnetic sensor 106 to measure an accurate magnetic field strength or a magnetic field direction. For example, the magnetic sensor 106 may measure a highly sensitive magnetic field, such as the Earth's magnetic field, which is typically about 0.5 to 0.6 Gauss or approximately $5 \times 10^{-5}$ Tesla.

In one embodiment, the magnetic sensor 106 may be a thin layer of an anisotropic magnetoresistive (AMR) film material, such as 81% Ni and 19% Fe. The AMR film may have a 2–3% change in resistance when exposed to a magnetic field. In another embodiment, the magnetic sensor 106 may also be a giant magnetoresistive (GMR) film material, which may comprise a Ni—Fe—Cu—Ni—Fe stack or any other combination, and may have a 3–100% change in resistance when exposed to a magnetic field. In still another embodiment, the magnetic sensor 106 may be a colossal magnetoresistive (CMR) film material, which may comprise lanthanum (La), strontium (Sr), manganese (Mn), and oxygen (O). The magnetic sensor 106 may comprise other materials as well.

In one embodiment, the magnetic sensor 106 may have a thickness less than approximately 200 angstroms. A layer of the film materials comprising the magnetic sensor 106 may be deposited over the magnetic buffer layer 104 and a desired formation of the magnetic sensor 106 may be etched within the layer of the film materials. The magnetic sensor 106 may be deposited on the magnetic buffer layer 104 using a PVD or ion-beam deposition process.

The magnetic sensor 106 may include a resistive Wheatstone bridge formed by a magnetoresistive metal film. When a power supply is connected to the bridge, the magnetic sensor 106 may convert any ambient or applied magnetic field in the sensitive direction to a voltage output.

The magnetic buffer layer 104 may enable the magnetic sensor 106 to be mounted directly over or in close proximity to the integrated circuit 102 and still maintain the ability to detect a sensitive magnetic field. In addition, the magnetic buffer layer 104 may prevent electromagnetic fields generated by the integrated circuit 102 from disturbing electromagnetic fields external from the magnetic sensing system 100. Without an electromagnetic shielding or absorbing layer between the magnetic sensor 106 and the integrated circuit 102, the electromagnetic fields generated by current flow within the integrated circuit 102 could saturate the magnetic sensor 106 and disallow the magnetic sensor 106 to detect an electromagnetic field external to the magnetic sensing system 100.

Figure 2:
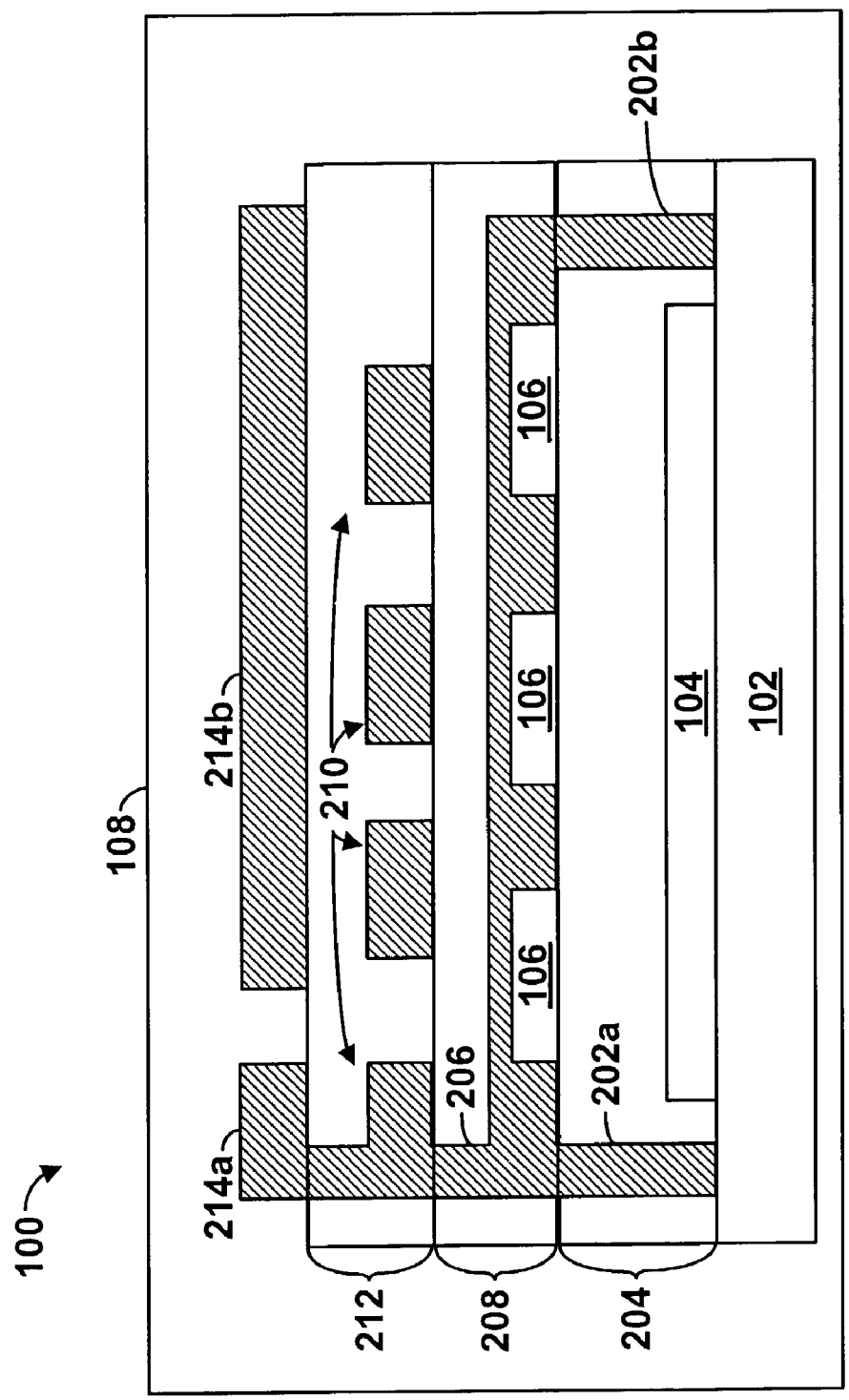
FIG. 2 is a more detailed illustration of one embodiment of the magnetic sensing system of FIG. 1.

Referring to FIG. 2, a detailed illustration of the magnetic sensing system 100 illustrated in FIG. 1 is shown. The integrated circuit 102 is mounted to a base of the package 108 and the magnetic buffer layer 104 is deposited onto the integrated circuit 102. First metal interconnects 202(a–b) are deposited over the magnetic buffer layer 104 and the integrated circuit 102. A dielectric layer 204 is deposited over the magnetic buffer layer 104 and the integrated circuit 102 and around the first metal interconnects 202(a–b). The magnetic sensor 106 may be deposited onto the dielectric layer 204 and etched to a desired formation. For example, as illustrated in FIG. 2, the magnetic sensor 106 comprises three small parallel sections. A second metal interconnect 206 is deposited over the magnetic sensor 106 in a manner such that it contacts the first metal interconnects 202(a–b).

Another dielectric layer 208 is deposited over the dielectric layer 204 and the second metal interconnect 206. A third metal interconnect 210 is deposited over the dielectric layer 208 in a manner such that it contacts the second metal interconnect 206. Another dielectric layer 212 is deposited over the third metal interconnect 210 and output metal interconnects 214(a–b) are deposited over the dielectric layer 212 such that the output metal interconnects 214(a–b) contact the third metal interconnect 210.

The number of dielectric layers and metal interconnects described within the magnetic sensing system 100 (and composition and thickness of each) are not critical to all embodiments of the invention, however, as other arrangements may still achieve advantages of the invention. Similarly, the construction described herein, namely a packaged integrated circuit arrangement, is just one example of the many different forms that may be used.

The dielectric layers 204, 208, and 212 may comprise a tetra-ethyl-ortho-silicate (TEOS) material or other insulating and/or non-conducting materials. In addition, the dielectric layers 204, 208, and 212 can be approximately 1–2 microns thick. Prior to depositing the dielectric layers 204, 208, and 212, a chemical mechanical polishing (CMP) process may be completed to smooth, flatten, and/or eliminate imperfections on the surfaces to which the dielectric layers 204, 208, and 212 may be deposited. The dielectric layers 204, 208, and 212 may be deposited using a PECVD process.

Figure 3:
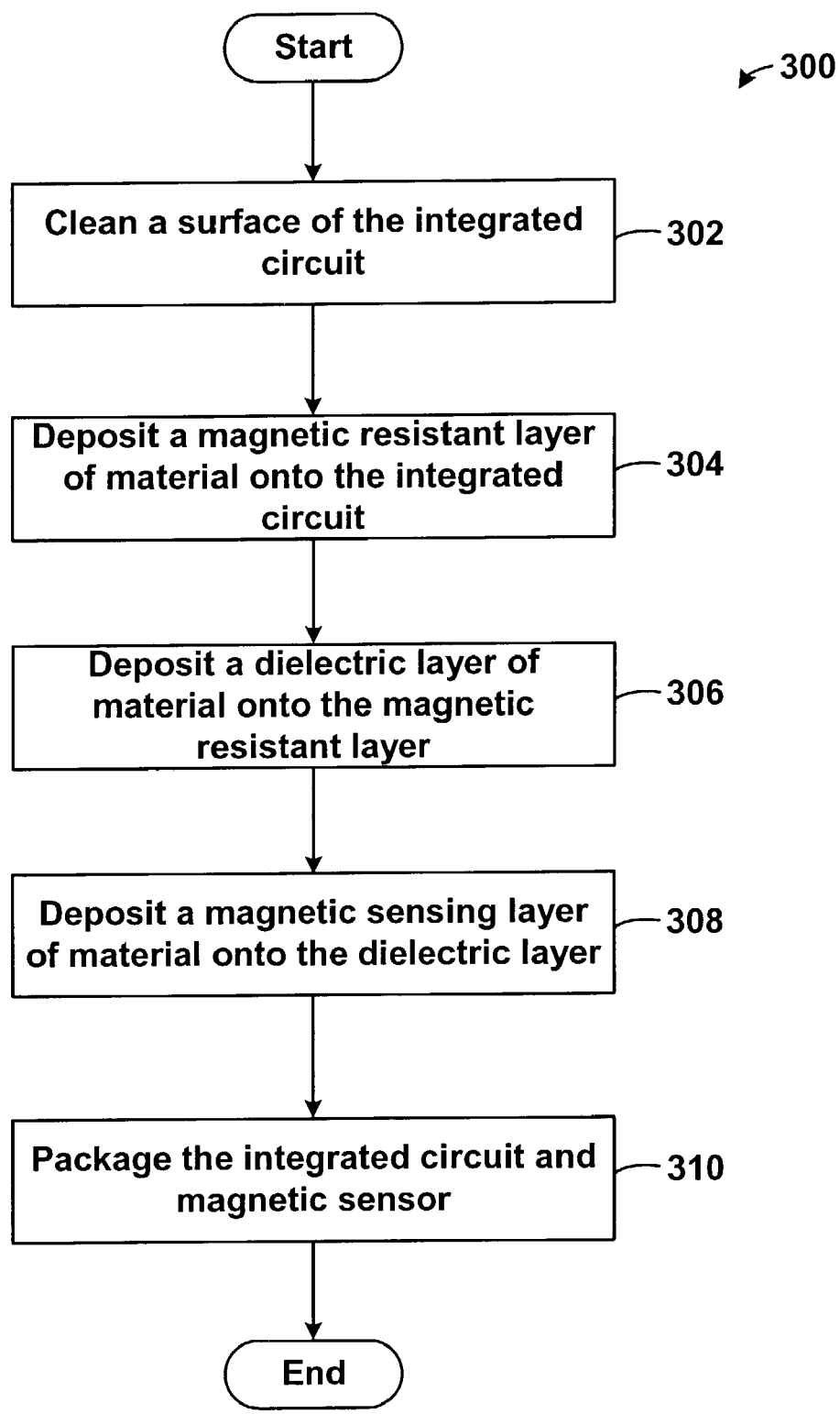
FIG. 3 is a functional block diagram of one embodiment of shielding a magnetic sensing device.

Referring to FIG. 3, a method 300 of internally shielding a magnetic sensing device is illustrated. As shown at block 302, a surface of an integrated circuit to which a layer of magnetic resistant material may be deposited is cleaned. The layer of magnetic resistant material may then be deposited upon the integrated circuit as shown at block 304, and a dielectric layer of material may be deposited onto the magnetic resistant layer, as shown at block 306. A magnetic sensing layer of material is then deposited onto the dielectric layer as shown at block 308, and the integrated circuit and magnetic sensor may then be packaged as shown at block 310. The layer of magnetic resistant material is deposited between the magnetic sensing layer and the integrated circuit to absorb electromagnetic signals generated by the integrated circuit.

Incorporating a magnetic resistant material between the magnetic sensor and the integrated circuit may eliminate the need to compensate for a magnetic field measurement distortion due to magnetic fields generated by internal sources of a sensing system. In addition, in existing magnetic sensing systems, it may not be possible to compensate for time-varying magnetic fields, such as those generated by an alternating current. Therefore, using a magnetic resistant material as a magnetic shield or magnetic absorption layer, enables an integral magnetic sensing device that has a magnetic sensor and an integrated circuit, to accurately measure properties of a magnetic field external to the device.

Those skilled in the art to which the present invention pertains may make modifications resulting in other embodiments employing principles of the present invention without departing from its spirit or characteristics. Accordingly, the described embodiments are to be considered in all respects only as illustrative, and not restrictive, and the scope of the present invention is, therefore, indicated by the appended claims rather than by the foregoing description. Consequently, modifications of structure, sequence, materials and the like apparent to those skilled in the art would still fall within the scope of the invention. Other examples are possible as well.

I claim:

1. A magnetic sensing device comprising:
   an integrated circuit having a mating surface;
   a magnetic shielding layer directly deposited onto the mating surface, wherein the magnetic shielding layer absorbs electromagnetic signals generated by the integrated circuit;
   a magnetic sensing layer deposited onto the magnetic shielding layer such that the magnetic sensing layer is substantially aligned with the integrated circuit, the magnetic sensing layer etched into multiple parallel sections;
   a first dielectric layer deposited between the magnetic shielding layer and the magnetic sensing layer;
   first metal interconnects coupling the multiple parallel sections of the magnetic sensing layer and the integrated circuit;
   a second dielectric layer deposited onto the magnetic sensing layer;
   second metal interconnects coupling the first metal interconnects to an output; and
   a sensor housing for enclosing a single combination of the integrated circuit, the magnetic shielding layer and the magnetic sensing layer.

2. The magnetic sensing device of claim 1, wherein the magnetic shielding layer deposited onto the mating surface is a layer of a permalloy material having a thickness of approximately 100–500 angstroms.

3. The magnetic sensing device of claim 1, wherein the magnetic shielding layer deposited onto the mating surface is a layer of a Mu-metal material having a thickness of approximately 100–500 angstroms.

4. The magnetic sensing device of claim 1, wherein the magnetic sensing layer deposited onto the magnetic shielding layer is an anisotropic magnetoresistive (AMR) film.

5. The magnetic sensing device of claim 1, wherein the magnetic sensing layer deposited onto the magnetic shielding layer is a giant magnetoresistive (GMR) film.

6. The magnetic sensing device of claim 1, wherein the magnetic sensing layer deposited onto the magnetic shielding layer has a thickness of less than 200 angstroms.

7. The magnetic sensing device of claim 1, wherein the magnetic sensing layer is deposited onto the magnetic shielding layer such that the magnetic sensing layer is directly over the integrated circuit.

8. A method of internally shielding a magnetic sensing device comprising providing a magnetic shielding layer between a magnetic sensing layer etched into multiple parallel sections and an integrated circuit, which is enclosed within a small outline integrated circuit (SOIC) microchip sensor housing, wherein the magnetic shielding layer is directly deposited on the integrated circuit and absorbs electromagnetic signals generated by the integrated circuit.

9. The method of claim 8, further comprising integrating the magnetic sensor and the integrated circuit within a common magnetic sensing device.

10. The method of claim 9, wherein integrating the magnetic sensor and the integrated circuit within the common magnetic sensing device comprises depositing a magnetoresistive (MR) film in a close proximity to the integrated circuit.

11. The method of claim 9, wherein integrating the magnetic sensor and the integrated circuit within the common magnetic sensing device comprises positioning the magnetic sensor to be substantially aligned with the integrated circuit.

12. The method of claim 8, wherein providing the magnetic shielding layer between the magnetic sensor and the integrated circuit comprises depositing a material selected from the group consisting of a permalloy material and a Mu-metal material.

13. The method of claim 8, wherein providing the magnetic shielding layer between the magnetic sensor and the integrated circuit comprises depositing a material having a thickness of approximately 100–500 angstroms.

14. The method of claim 8, further comprising depositing an insulating layer between the magnetic sensor and the magnetic shielding layer.

* * * * *